(12) United States Patent
Huang et al.

(10) Patent No.: US 11,646,709 B1
(45) Date of Patent: May 9, 2023

(54) MULTI-BAND LIMITER SYSTEM AND METHOD FOR AVOIDING CLIPPING DISTORTION OF ACTIVE SPEAKER

(71) Applicant: HARMAN INTERNATIONAL INDUSTRIES, INCORPORATED, Stamford, CT (US)

(72) Inventors: Mengrui Huang, Shenzhen (CN); Hongfei Zhou, Shenzhen (CN)

(73) Assignee: HARMAN INTERNATIONAL INDUSTRIES, INCORPORATED, Stamford, CT (US)

( * ) Notice: Subject to any disclaimer, the term of this patent is extended or adjusted under 35 U.S.C. 154(b) by 0 days.

(21) Appl. No.: 17/536,766

(22) Filed: Nov. 29, 2021

(51) Int. Cl.
| | |
|---|---|
| *H04R 3/00* | (2006.01) |
| *H03G 5/16* | (2006.01) |
| *H03G 9/02* | (2006.01) |
| *H04R 3/14* | (2006.01) |

(52) U.S. Cl.
CPC .............. *H03G 5/165* (2013.01); *H03G 9/025* (2013.01); *H04R 3/007* (2013.01); *H04R 3/14* (2013.01); *H04R 2201/028* (2013.01)

(58) Field of Classification Search
CPC .......... H04R 3/00; H04R 3/005; H04R 3/007; H04R 3/04; H04R 3/14; H04R 2201/028; H04R 2203/00; H03G 5/00; H03G 5/165; H03G 9/00; H03G 9/025; H04G 11/00; H04G 11/008
See application file for complete search history.

(56) References Cited

U.S. PATENT DOCUMENTS

| | | | |
|---|---|---|---|
| 8,351,621 B2* | 1/2013 | Lehnert ................. H04R 3/007 327/309 |
| 8,532,305 B2* | 9/2013 | Vickers .................... H04S 5/00 381/17 |
| 9,607,626 B1* | 3/2017 | Yang ................... G10L 21/0208 |
| 2017/0111020 A1* | 4/2017 | Song ..................... H04R 3/002 |
| 2021/0168502 A1* | 6/2021 | Huang .................. H04R 3/007 |

* cited by examiner

*Primary Examiner* — Thang V Tran
(74) *Attorney, Agent, or Firm* — Brooks Kushman P.C.

(57) ABSTRACT

A limiter system for an active speaker may include at least one lowpass filter configured to receive an input signal and output a signal lower than a crossover frequency, at least one highpass filter, configured to receive an input signal and output a signal higher than the crossover frequency, a first allpass filter configured to adjust the phase of the signal lower than the crossover frequency, a second allpass filter configured to adjust the phase of the signal higher than the crossover frequency, a first limiter, configured to receive and limit the signal from the first allpass filter, a second limiter, configured to receive and limit the signal from the second allpass filter, and a mixer, configured to mix the signal lower from the first limiter and the signal from the second limiter.

20 Claims, 6 Drawing Sheets

MULTI-BAND LIMITER SYSTEM AND METHOD FOR AVOIDING CLIPPING DISTORTION OF ACTIVE SPEAKER

TECHNICAL FIELD

The present disclosure generally relates to a limiter system and a method for an active speaker. More specifically, the present disclosure relates to a limiter system and a method for avoiding clipping distortion when an input signal amplitude is large.

BACKGROUND

An audio signal is a carrier of regular sound wave frequency and amplitude change information. Regular audio may be represented by a sound wave or a sine wave. The sine wave includes three important parameters: frequency, amplitude, and phase, which also characterize the audio signal. Taking music as an example, people's perception of sound frequency is expressed as pitch. A higher pitch corresponds to a higher frequency. The amplitude reflects the energy magnitude of a signal. A high-amplitude waveform signal has a larger volume, and a low-amplitude waveform has a quieter sound.

In an active speaker system, when an input signal has an excessively large amplitude, and has a voltage exceeding a maximum voltage that can be output by a power amplifier after being amplified by a power amplifier, the peak and dip of the output signal waveform will be clipped, resulting in audible clipping distortion. Since the bass performance of a speaker largely depends on the size of the speaker, in order to obtain a good bass performance with a limited speaker size, a low-frequency signal needs to be amplified as much as possible, so the low-frequency signal is more likely to reach a maximum voltage limit of the amplifier. In the speaker design, a limiter is usually used to limit a maximum output voltage to a specific output level.

Therefore, a limiter, also called a clipper, is usually used in a speaker system to limit a signal so as not to exceed a maximum voltage limit of the system. A conventional limiter limits signals at all frequencies below a limiting threshold. However, since music is usually a dynamic broadband signal, the effect of this configuration is not very satisfactory. For example, when adding heavy bass, a low-frequency signal with an amplitude that reaches or exceeds the maximum voltage limit may suddenly appear in the music and impact the limiter, resulting in signals at all frequencies being equally compressed. This means that when such low-frequency signals appear, the volume of human voices at higher frequencies will suddenly drop. As this low-frequency signal disappears, the volume of human voices will suddenly increase again.

Another conventional limiter may impose different limiting thresholds on different bands. Taking a limiter of two bands as an example, a signal at a frequency close to a crossover frequency will be filtered out by both of a lowpass filter and a highpass filter. When the amplitude of an input signal is large enough, the signal amplitude of a signal mixed by a mixer will exceed a limit value, resulting in audible clipping distortion. Therefore, in order to avoid this clipping noise, the limiter must be set to a lower gain to reduce a maximum sound level of the speaker system.

SUMMARY

A limiter system for an active speaker may include at least one lowpass filter configured to receive an input signal and output a signal lower than a crossover frequency, at least one highpass filter, configured to receive an input signal and output a signal higher than the crossover frequency, a first allpass filter configured to adjust the phase of the signal lower than the crossover frequency, a second allpass filter configured to adjust the phase of the signal higher than the crossover frequency, a first limiter, configured to receive and limit the signal from the first allpass filter, a second limiter, configured to receive and limit the signal from the second allpass filter, and a mixer, configured to mix the signal lower from the first limiter and the signal from the second limiter.

A limiting method for an active speaker may include performing lowpass filtering by at least one lowpass filter to output a signal lower than a crossover frequency, performing highpass filtering to output a signal higher than the crossover frequency, manipulating a first phase of the signal lower than the crossover frequency, manipulating a second phase of the signal higher than the crossover frequency, limiting the signal at the first phase, limiting the signal at the second phase, and mixing the limited signals.

BRIEF DESCRIPTION OF THE DRAWINGS

These and/or other features, aspects and advantages of the present disclosure will be better understood after reading the following detailed description with reference to the drawings. Throughout these drawings, the same numeral references represent the same components, where.

DETAILED DESCRIPTION

As required, detailed embodiments of the present invention are disclosed herein; however, it is to be understood that the disclosed embodiments are merely exemplary of the invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present invention.

Disclosed herein is a dual-band limiter system having two lowpass and/or two highpass filters, as well as one allpass filter. These filters may be arranged before the limiter. Another set of lowpass and/or highpass filters may be arranged after the limiter, in each band. This arrangement may impose different limiting thresholds on different bands so that a maximum sound level of the system does not exceed a maximum voltage limit of a speaker system, thereby avoiding clipping distortion. This may be especially important when the input signal has a high amplitude. In the examples herein, the signal source is divided into a low-frequency band and a high-frequency band for processing respectively. An allpass filter is arranged at each band before the limiter to adjust the phase of the signals.

Figure 1:
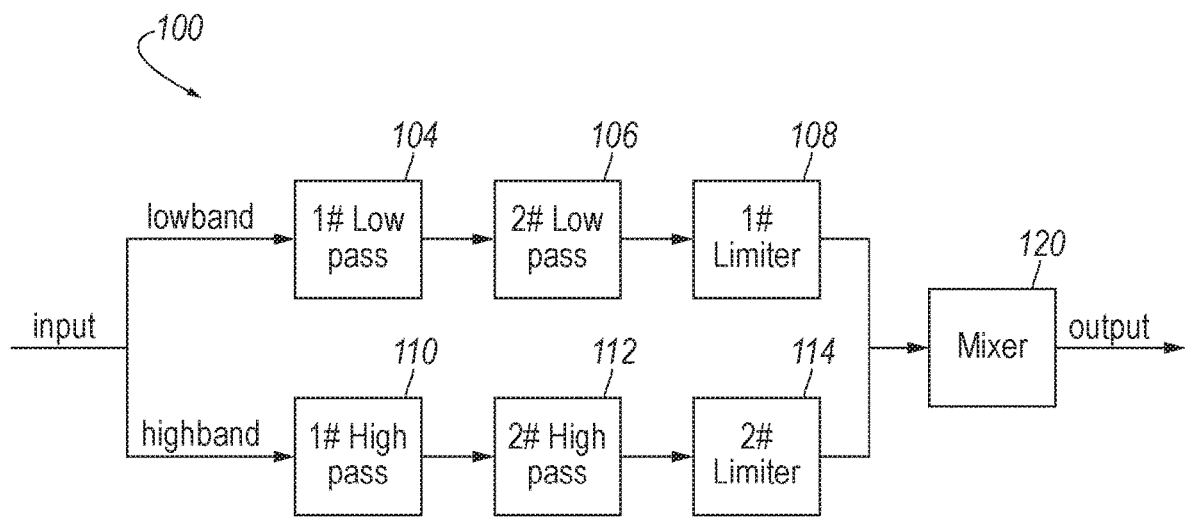
FIG. 1 shows a structure of a limiter system according to one embodiment.

FIG. 1 illustrates an example limiter system 100 having a first lowpass filter 104, a second lowpass filter 106, and a first limiter 108, in the lowband. The limiter system 100 includes a first highpass filter 110, a second highpass filter 112, and a second limiter 114 in the highland. The limiter system 100 includes a mixer 120.

An audio signal (for example, music) from a signal source (not shown) may be divided into a low-frequency band, and a high-frequency band for processing respectively. Although not shown, the audio signal may first enter a first equalization filter for equalization filter tuning. For the use of an equalization filter, tuned parameters mainly include a center frequency fc, a quality factor Q, and a gain G. The first equalization filter may increase a peak shape of a signal with a center frequency $f_{c\_EQI}$, that is, at this moment, a gain $G_{EQI}$ is positive, while signals with other frequencies are not processed. This adjustment enables the signal to gain at the center frequency $f_{c\_EQI}$ of first equalization filter so that a very high level can be obtained, while other frequency levels remain unchanged, resulting in the sound loudness at the center frequency $f_{c\_EQI}$ being greater than the sound at other frequencies.

For a speaker, a signal generated by a signal source is an audio signal with, for example, an audio frequency. As known to those skilled in the art, the range of the full audio frequency is roughly between 20 Hz and 20 kHz. The limiter system provided by the present disclosure may be applied to an audio signal with an input signal within the full audio frequency range. For such an audio input signal, a lowpass filter and a highpass filter may be used for crossover to form two parts: a signal lower than a crossover frequency and a signal higher than the crossover frequency.

A case is taken as an example. In order to retain a human voice part, for example, contained in an audio signal unchanged, considering that the frequency range of the human voice is approximately from 300 Hz to 3400 kHz, the audio signal may determine a part higher than, for example, 300 Hz as a high-frequency band and a part lower than, for example, 300 Hz as a low-frequency band. Therefore, referring to limiter system 100 shown in FIG. 1, a cutoff frequency $f_{cutoff\_Lp}$ of each of the first lowpass filter 104 and the second lowpass filter 105 may be set to, for example, 300 Hz, and a cutoff frequency $f_{cutoff\_Hp}$ of each of the first highpass filter 110 and the second highpass filter 112 may also be set to, for example, 300 Hz. In this case, lowpass filters 104, 106 and the highpass filters 110, 112 are based on the same cutoff frequency. The cutoff frequency is called a crossover frequency $f_{crossover}$. For example, the crossover frequency in limiter system 100 shown in FIG. 1 is set to, for example, $f_{crossover}$=300 Hz. The lowpass filters 104, 106, and the highpass filters 110, 112 may be second order filters, having Q=0.707.

Next, after lowpass filters 014, 106 filter out the signal higher than the crossover frequency, the remaining signals lower than the crossover frequency enter first limiter 108. First limiter 108 may have a first limiting threshold $Th_{limiter\_1}$, that is, a maximum amplitude value. If the signal lower than the crossover frequency exceeds the first limiting threshold $Th_{limiter\_2}$ at this moment, the signal lower than the crossover frequency is wholly compressed not to exceed the first limiting threshold. It can be seen that when the input signal lower than the crossover frequency is large enough, the signal lower than the crossover frequency in the first limiter may be compressed wholly, and when the input signal lower than the crossover frequency is small, the first limiter may not operate.

Correspondingly, in the high-frequency band part, as shown in FIG. 1, after the highpass filters 110, 112 filter out the signal lower than the crossover frequency, the retained high-frequency signal enters second limiter 114. The second limiter 114 has a second limiting threshold (clipping value) $Th_{limiter\_2}$. If the signal higher than the crossover frequency exceeds the second limiting threshold $Th_{limiter\_2}$ at this moment, the signal higher than the crossover frequency is wholly compressed not to exceed the second limiting threshold. In other words, when the input signal higher than the crossover frequency is large enough, the signal higher than the crossover frequency in the second limiter may be compressed wholly, and when the input signal higher than the crossover frequency is small, the second limiter may not operate.

The signals, after being limited by the first limiter 108 and the second limiter 114 respectively, enter a mixer 120. The mixer 120 outputs audio signals that have undergone separate limiting processing on different hands, so the maximum limiting threshold is not set equally for all frequencies. For dynamic broadband signals such as music, for example, in the case of enhanced bass, low-frequency signals with amplitude exceeding the maximum voltage limit may suddenly appear in the music, which will cause the signals at all frequencies to be equally compressed.

Although not shown, the limiter system 100 may include second equalization filter arranged after the mixer 120. This second equalization filter may be a dip equalization filter. In the second equalization filter, an audio signal at a center frequency $f_{C\_EQ2}$ of second equalization filter is attenuated and the waveform drops, that is, a gain $G_{EQ2}$ of second equalization filter is set to be negative herein. Therefore, it may also be regarded as a decreased gain, and other frequency signals are not processed.

Figure 2:
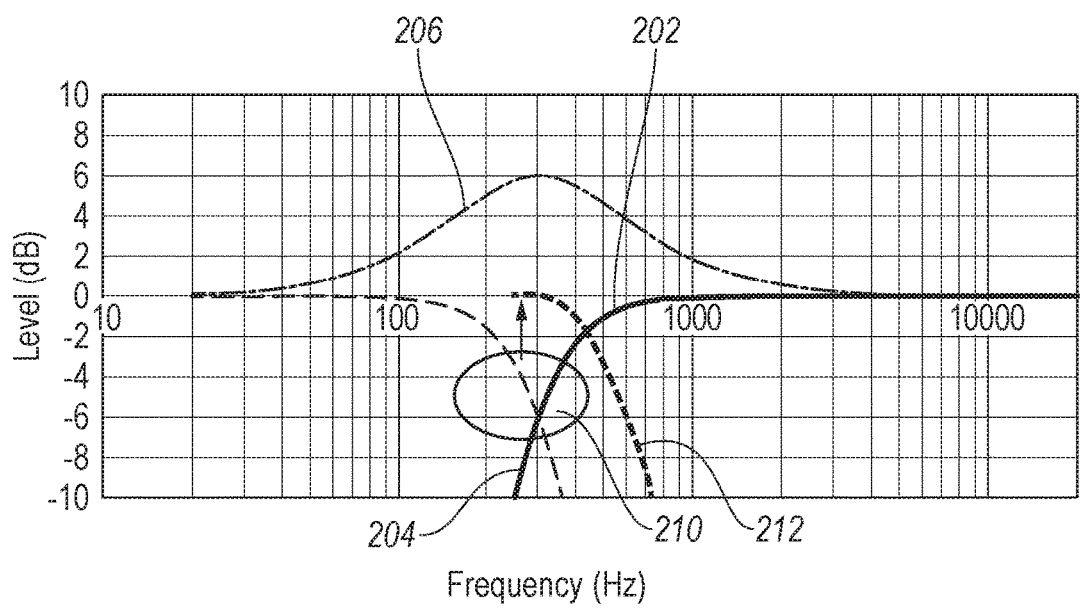
FIG. 2 illustrates electrical frequency response curves of an output signal processed by the limiter system of FIG. 1.

FIG. 2 illustrates electrical frequency response curves of an output signal processed by the limiter system 100 of FIG.

1. Specifically, FIG. 2 illustrates a first response curve 202 of the first limiter 108 and a second response curve 204 of the second limiter 114. In this example, when a limiting threshold $Th\_{limiter\_1}$ of the first limiter 108 is set to 0 dB, it can be seen that after being processed by the lowpass filters 104, 106 and first limiter 108, a signal lower than a cutoff frequency $f\_{cutoff\_Lp}$ of the lowpass filters 104, 106, that is, a crossover frequency $f\_{crossover}$ passes through, and a frequency signal higher than the crossover frequency $f\_{crossover}$ is suppressed. The first response curve 202 of a signal output by first limiter 108 after limiting is not greater than 0 dB.

The second response curve 204 is also illustrated in FIG. 2. In this example, when a limiting threshold $Th\_{limiter\_2}$ of the second limiter 114 is also set to 0 dB, it can be seen that after being processed by the highpass filters 110, 112 and the second limiter 114, a signal higher than a cutoff frequency $f\_{cutoff\_Hp}$ of the highpass filters 110, 112, that is, a crossover frequency $f\_{crossover}$ passes through, and a frequency signal higher than the crossover frequency $f\_{crossover}$ is suppressed. The second response curve 204 of a signal output by second limiter 114 after limiting is not greater than 0 dB.

FIG. 2 also shows a third response curve 206 of an audio signal after being mixed in mixer 120. It can be seen from FIG. 2 that in the above example, the electrical frequency response curve of the output signal after mixing in mixer 120 has a higher peak shape within a frequency range of 100 Hz to 1 kHz, which exceeds the threshold 0 dB of first limiter 108 and second limiter 114 in limiter system 100.

This may be the result because actual filtering of a signal by lowpass filters and highpass filters cannot make the signal stop suddenly at the cutoff frequency of the respective filter, but instead attenuates to a certain extent at the cutoff frequency. For example, in limiter system 100, the first and second response curves 202, 204 of two output signals intersect with a certain slope at the crossover frequency 210. In this example, the two signals are attenuated to dB at this moment, as shown in FIG. 2. Therefore, the amplitude of the superimposed signal after mixing the two signals in mixer 120 is exactly 0 dB. Therefore, when the input signal continues to increase and exceeds −6 dB, the amplitude of the superimposed signal after mixing the two signals in mixer 120 is higher, which is higher than the limiting threshold 0 dB of the limiter.

Further, when the input signal amplitude continues to increase, both the lowband and the highband signals around this area may increase up to the limiting threshold. This is indicated by a fourth response curve 212. When this occurs the signal amplitude following the mixer 120 will exceed the threshold value up to 6 dB, as explained above, and result in clipping distortion (see third response curve 206).

Figure 3:
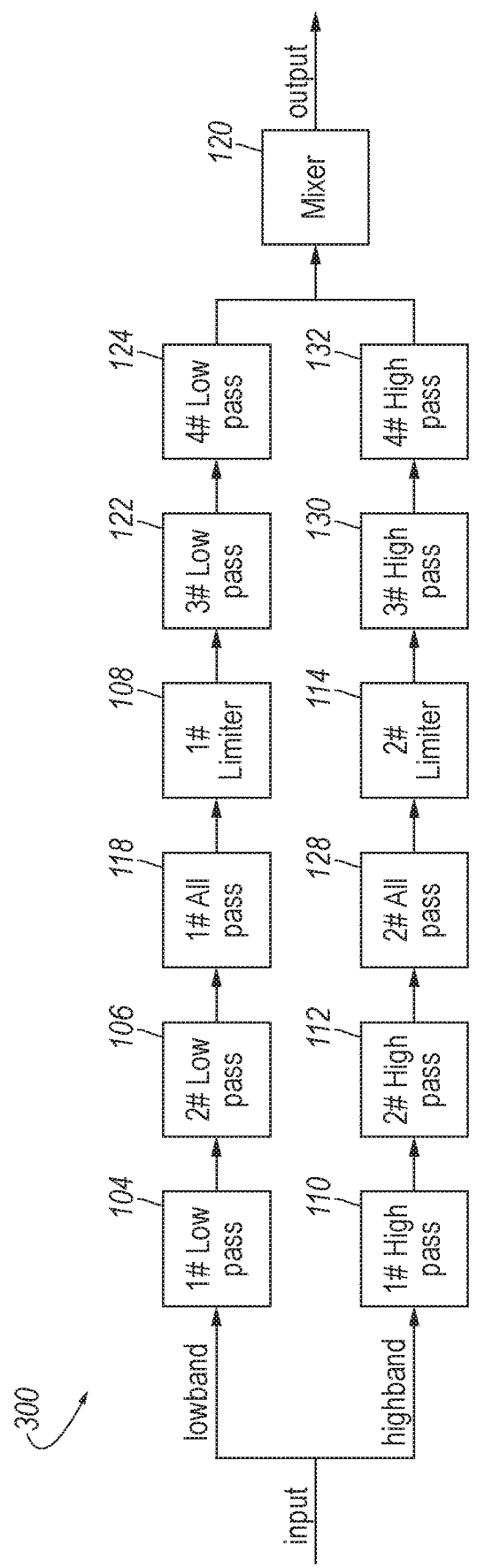
FIG. 3 shows a structure of a limiter system according to one embodiment.

FIG. 3 illustrates another example limiter system 300 having the first lowpass filter 104, second lowpass filter 106, and a first limiter 108, in the lowband. In contrast with the limiter system 100 illustrated in FIG. 1, the limiter system 300 also includes a first allpass filter 118, third lowpass filter 122, and fourth lowpass filter 124 in the lowband. The limiter system 300 includes the first highpass filter 110, second highpass filter 112, and second limiter 114 in the highband. Similarly, the highball also includes a second allpass filter 128, third highpass filter 130, and fourth highpass filter 132.

As with FIG. 1, an incoming audio signal (for example, music) from a signal source (not shown) may be divided into a low-frequency band and a high-frequency band for processing respectively. Although not shown, the audio signal may first enter the first equalization filter for equalization filter tuning as described above with respect to FIG. 1.

Further, for a speaker, a signal generated by a signal source is an audio signal with, for example, an audio frequency. As known to those skilled in the art, the range of the full audio frequency is roughly between 20 Hz and 20 kHz. The limiter system provided by the present disclosure may be applied to an audio signal with an input signal within the full audio frequency range. For such an audio input signal, a lowpass filter and a highpass filter may be used for crossover to form two parts: a signal lower than, a crossover frequency and a signal higher than the crossover frequency.

Again, the frequency range of the human voice is approximately from 300 Hz to 3400 kHz, the audio signal may determine a part higher than, for example, 300 Hz as a high-frequency band and a part lower than, for example, 300 Hz as a low-frequency band. Therefore, referring to limiter system 300 shown in FIG. 3, a cutoff frequency $f\_{cutoff\_Lp}$ of each of the first lowpass filter 104 and the second lowpass filter 105 may be set to, for example $2 f\_{crossover}$, or 600 Hz, and a cutoff frequency $f\_{cutoff\_Hp}$, of each of the first highpass filter 110 and the second highpass filter 112 may also be set to, for example, $½f\_{crossover}$, or 150 Hz. In this case, lowpass filters 104, 106 and the highpass filters 110, 112 are based on the same cutoff frequency. If a lowpass filter and a highpass filter in a system have the same cutoff frequency, it may be referred to as a crossover frequency $f\_{crossover}$. For example, the crossover frequency in limiter system 300 shown in FIG. 3, e.g., the cutoff frequency of lowpass filter 122, 124 and highpass filters 130, 132, may be set to, for example, $f\_{crossover}$=300 Hz. The lowpass filters 104, 106, and the highpass filters 110, 112 may be second order filters, having Q=0.707.

The first allpass filter 118 may allow all frequencies to pass therethrough, but may modify the phase of the input signal. The first allpass filter 118 may be a second order filter, where $f\_{cutoff\_Lp}=2f\_{crossover}$, and Q=0.707.

Similarly, in the highband, the second allpass filter 128 may allow all frequencies to pass therethrough, but may modify the phase of the input signal. The first allpass filter 118 may be a second order filter, where $f\_{cutoff\_Lp}=$, $½f\_{crossover}$, and Q=0.707.

After the lowpass filters 104, 106 filter out the signal higher than the crossover frequency, the remaining signals lower than the crossover frequency enter the first allpass filter 118. The allpass filter 118 may allow for all of the frequencies to pass, but modify the phase. In the example herein, the allpass filter 118 may modify the phase to be around the crossover frequencies of the lowband signals. This is described in more detail here. Notably, the phase of the lowband and highband signals will be different from each other.

The signal may then enter the first limiter 108. Similar to the limiter system 100 of FIG. 1, the first limiter 108 may have a first limiting threshold $Th\_{limiter\_1}$, that is, a maximum amplitude value. If the signal lower than the crossover frequency exceeds the, first limiting threshold $Th\_{limiter\_1}$ at this moment, the signal lower than the crossover frequency is wholly compressed not to exceed the first limiting threshold. It can be seen that when the input signal lower than the crossover frequency is large enough, the signal lower than the crossover frequency in the first limiter 108 may be compressed wholly, and when the input signal lower than the crossover frequency is small, the first limiter may not operate.

Correspondingly, in the high-frequency band part, as shown in FIG. 3, after the highpass filters 110, 112 filter out the signal lower than the crossover frequency, the retained high-frequency signal enters the second allpass filter 128 prior to entering the second limiter 114. The second limiter 114 has a second limiting threshold (clipping value) $Th_{\_limiter\_2}$. If the signal higher than the crossover frequency exceeds the second limiting threshold $Th_{\_limiter\_2}$ at this moment, the signal higher than the crossover frequency is wholly compressed not to exceed the second limiting threshold. In other words, when the input signal higher than the crossover frequency is large enough, the signal higher than the crossover frequency in the second limiter may be compressed wholly, and when the input signal higher than the crossover frequency is small, the second limiter may not operate.

The signal in the lowband, after being limited by the first limiter 108, may enter the third lowpass filter 122 and the second lowpass filter 124. These filters may have a cutoff frequency $f_{\_cutoff\_Lp}$ which may be set to, for example, 300 Hz. The third and fourth lowpass filters 122, 124, may be second order filters, having Q=0.707.

The signal in the highband, after being limited by the second limiter 114, may enter the third highpass filter 130 and the second highpass filter 130 These filters may have a cutoff frequency $F_{\_cutoff\_Hp}$ which may be set to, for example, 300 Hz. The third and fourth highpass filters 130, 132, may be second order filters, having Q=0.707. In this case, the third and fourth lowpass filters 122, 124 and the third and fourth highpass filters 130, 132 are based on the same cutoff frequency.

The signals, after being filtered by the third and fourth lowpass filters 122, 124 and the third and fourth highpass filters 130, 132 respectively, enter a mixer 120. As explained, the mixer 120 outputs audio signals that have undergone separate limiting processing on different bands, so the maximum limiting threshold is not set equally for all frequencies. For dynamic broadband signals such as music, for example, in the case of enhanced bass, low-frequency signals with amplitude exceeding the maximum voltage limit may suddenly appear in the music, which will cause the signals at all frequencies to be equally compressed.

Again, although not shown, the limiter system 100 may include second equalization filter arranged after the mixer 120. This second equalization filter may be a dip equalization filter. In the second equalization filter, an audio signal at a center frequency $f_{C\_EQ2}$ of second equalization filter is attenuated and the waveform drops, that is, a gain $G_{\_EQ2}$ of second equalization filter is set to be negative herein. Therefore, it may also be regarded as, a decreased gain, and other frequency signals are not processed.

The addition of the third and fourth lowpass filters 122, 124 and the third and fourth highpass filters 130, 132 behind the limiter allow the limiter system 300 to avoid having amplitude that exceed the threshold after the mixer 120. The first and second lowpass filters 104, 106 and the first and second highpass filters 110, 112, prevent instability in the vocal ranges of the signal. The first and second allpass filters 118, 128 allow for all frequencies to pass, but a modification to the phase, which may have been inadvertently altered by the first and second lowpass filters 104, 106 and the first and second highpass filters 110, 112.

Figure 4A:
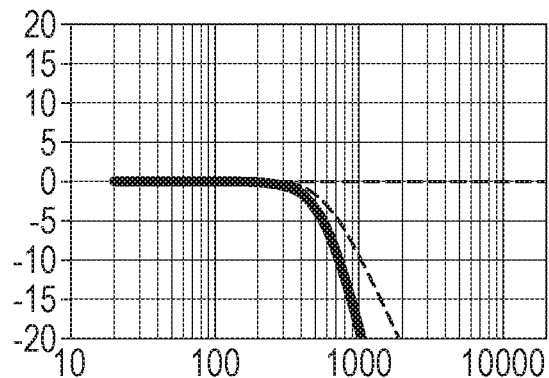
FIG. 4A illustrates a frequency response curve of an example lowband signal following the second lowpass filter of the limiter system of FIG. 3.

FIG. 4A illustrates a frequency response curve of an example lowband signal following the second lowpass filter 106 of the limiter system 300.

Figure 4B:
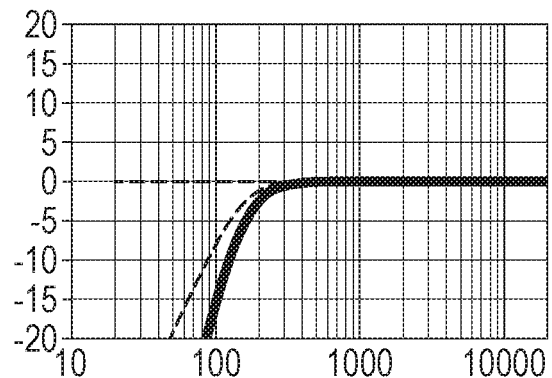
FIG. 4B illustrates a frequency response curve of an example highband signal following the second highpass filter of the limiter system of FIG. 3.

FIG. 4B illustrates a frequency response curve of an example highband signal following the second highpass filter 112 of the limiter system 300.

Figure 5A:
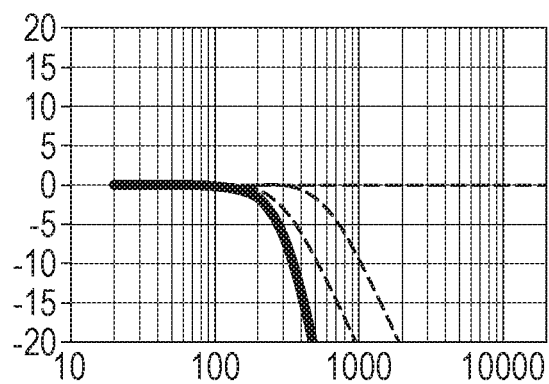
FIG. 5A illustrates a frequency response curve of an example log band signal following the fourth lowpass filter of the limiter system of FIG. 3.

FIG. 5A illustrates a frequency response curve of an example lowband signal following the fourth lowpass filter 124 of the limiter system 300. In comparison with the lowband signal of FIG. 4A, the signal in FIG. 5A has been filtered to 300 Hz.

Figure 5B:
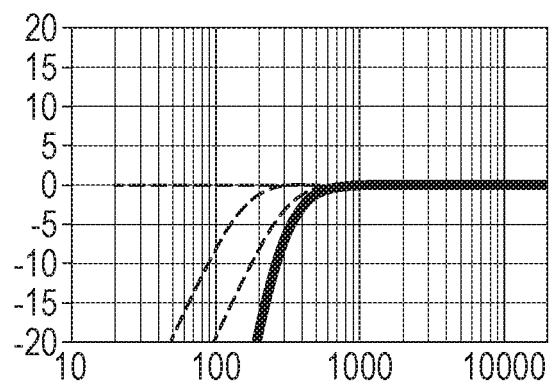
FIG. 5B illustrates a frequency response curve of an example highband signal following the fourth highpass filter of the limiter system of FIG. 3.

FIG. 5B illustrates a frequency response curve of an example highband signal following the fourth highpass filter 132 of the limiter system 300. In comparison with the highband signal of FIG. 4B, the signal in FIG. 5B has been filtered to 300 Hz.

Figure 6:
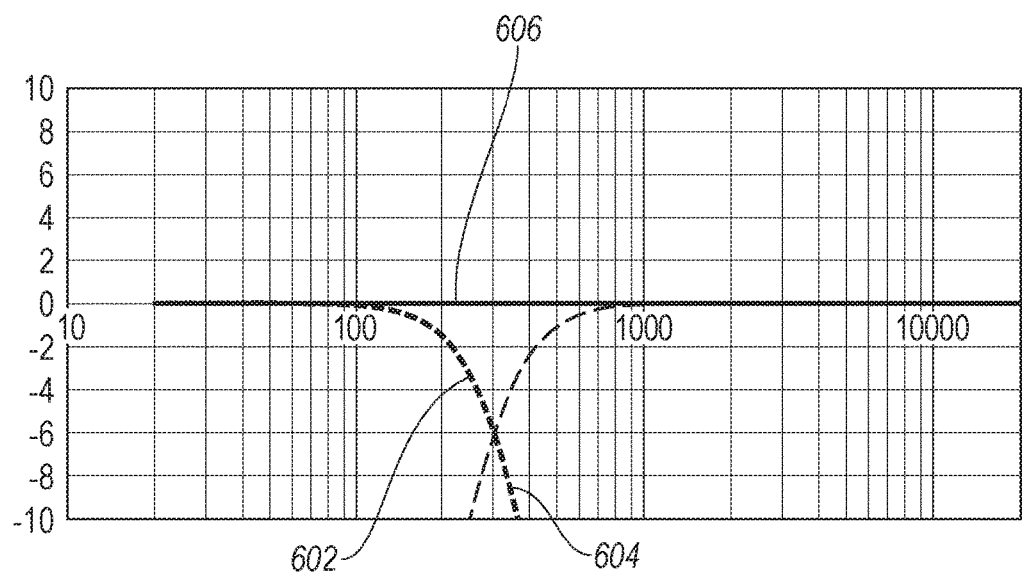
FIG. 6 illustrates frequency response curves of the example lowband signal and highband signal, and a response curve of the signal after the mixer of the limiter system of FIG. 3.

FIG. 6 illustrates frequency response curves of the example lowband signal and highband signal, and a response curve of the signal after the mixer 120 of the limiter system 300. Specifically, a first response curve 602 similar to that of FIG. 5A, and a second response curve 604 similar to that of FIG. 5B. A third response curve 606 may represent the response following the mixer 120. As illustrated, the response is relatively steady at around 0 dB.

Figure 7A:
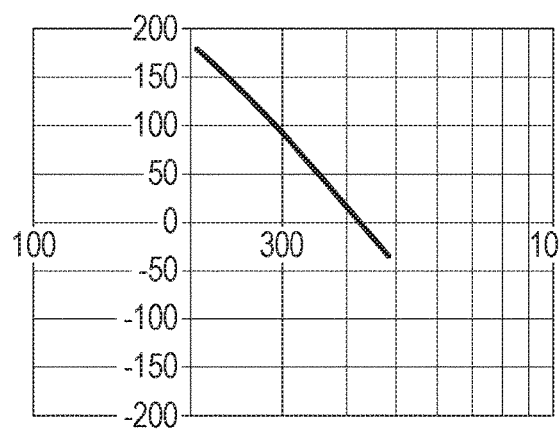
FIG. 7A illustrates a phase curve of the signal phases following the fourth to pass filter but without the application of the first allpass filter of the limiter system of FIG. 3.

FIG. 7A illustrates a phase curve of the signal phases following the fourth lowpass filter 124 but a without the application of the first allpass filter 118.

Figure 7B:
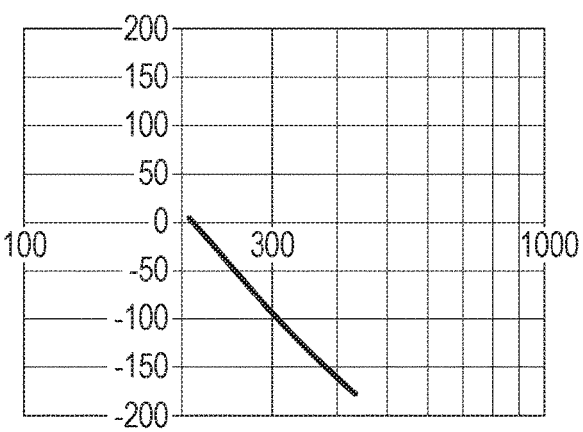
FIG. 7B illustrates a phase curve of the signal phases following the fourth highpass filter 132 but without the application of the second allpass filter of the limiter system of FIG. 3.

FIG. 7B illustrates a phase curve of the signal phases following the fourth highpass filter 132 but without the application of the second allpass filter 128.

Figure 8:
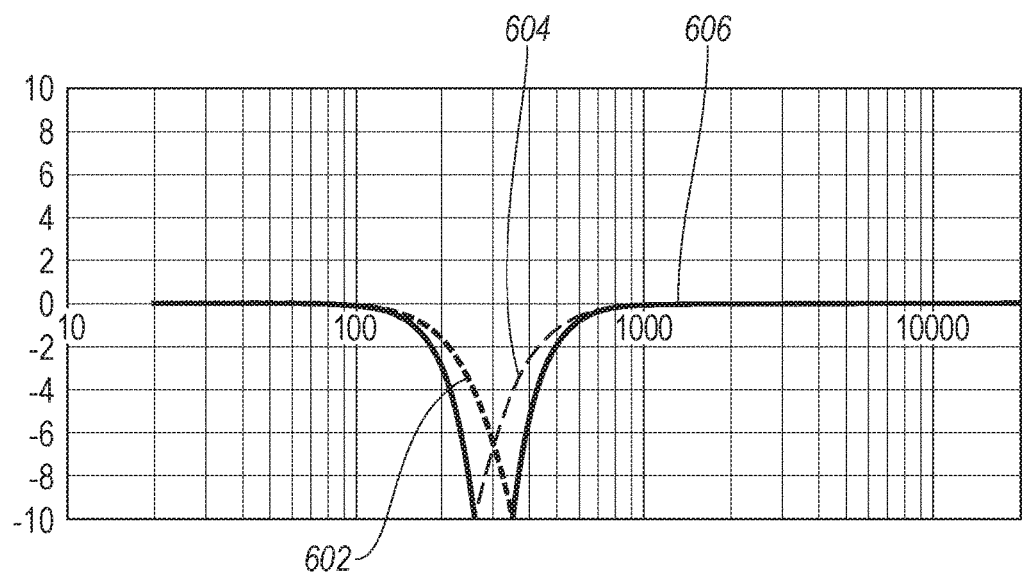
FIG. 8 illustrates frequency response curves of the example lowband signal and highband signal, both, before and after the mixer, but without the application of the first and second allpass filters of the limiter system of FIG. 3.

FIG. 8 illustrates frequency response curves of the example lowband signal and highband signal, both before (as illustrated by first response 602 and second response 604) and after the mixer 120 (as illustrated collectively by third response 806), but without the application of the first and second allpass filters 118, 128.

Figure 9A:
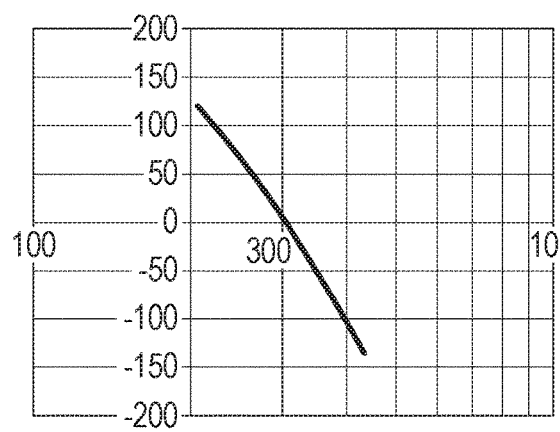
FIG. 9A illustrates a phase curve of the signal phases following the fourth lowpass filter 124 with the application of the first allpass filter 118 of the limiter system of FIG. 3.

FIG. 9A illustrates a phase curve of the signal phases following the fourth lowpass filter 124 with the application of the first allpass filter 118. In contrast with the phase curve of FIG. 7A, the allpass filter has modified the phase of the limiter system 300.

Figure 9B:
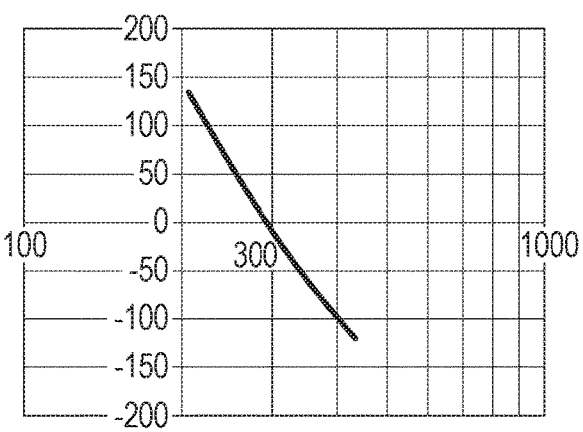
FIG. 9B illustrates a phase curve of the signal phases following the fourth highpass filter with the application of the second allpass filter 128 of the limiter system of FIG. 3.

FIG. 9B illustrates a phase curve of the signal phases following the fourth highpass filter 132 with the application of the second allpass filter 128. In contrast with the phase curve of FIG. 7B, the allpass filter has modified the phase of the limiter system 300. Notably, the phase of the lowband signal (e.g., as illustrated in FIG. 8A), differs from that of the highband signal (e.g., as illustrated in FIG. 8B).

Figure 10:
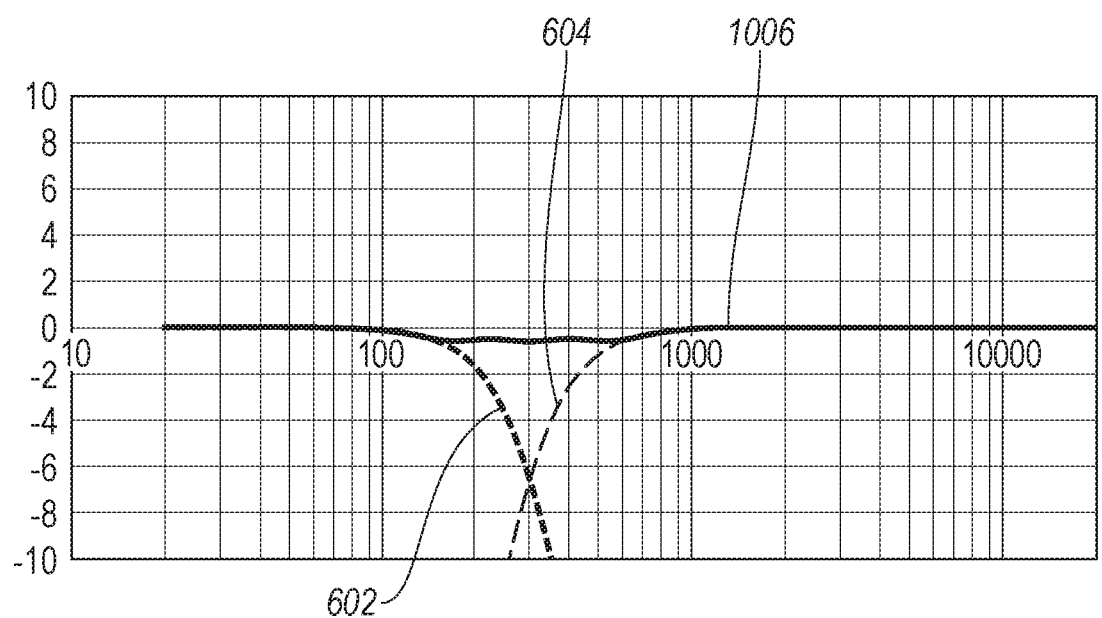
FIG. 10 illustrates, frequency response curves of the example lowband signal and highband signal, both before and after the mixer, with the application of the first and second allpass filters of the limiter system of FIG. 3.

FIG. 10 illustrates frequency response curves of the example lowband signal and highband signal, both before (as illustrated by first response 602 and second response 604) and after the mixer 120 (as illustrated collectively by third response 1006), with the application of the first and second allpass filters 118, 128. As illustrated, and in comparison with FIG. 2, the limiter system 300, including the allpass filters 118, 128, and highpass and lowpass filters both before, and after the respective limiters, prevents signal amplitude from exceeding the threshold caused by superposition.

The parameters discussed herein with respect to the filters and other components are merely examples and may be altered. Various settings and relationships of the above parameters is implemented in an example state. In fact, in the use of a speaker, a user often selects an audio signal from a signal source as a favorite sound effect, such as pop, rock, dance, classical, jazz, metal or heavy bass, which is actually tuned through different settings of an equalization filter in order to achieve a more ideal effect. On the other hand, the user can also manually tune the gain and quality factor of each frequency of the equalization filter, and by using the equalizer to process input signals of different frequencies, the speaker may be compensated and modified. In this case, it is likely that when audio signals of other frequencies need to be tuned, various changes in the quality factor and gain, as well as the tuning of adjacent frequencies, will affect the crossover frequency)

In summary, the limiter system 300 and the method provided by the present disclosure can reduce the voltage close to the crossover frequency after passing through the mixer 120 by adding the allpass filters and third and fourth filters on each of the lowband and the highland thereby adjusting the phase and avoiding clipping distortion to a large extent.

For illustrative purposes, the present disclosure has provided a description of the embodiments, but the described embodiments are not exhaustive or limited to the embodiments disclosed herein. Without departing from the scope and spirit of the described embodiments, those of ordinary skill in the art will appreciate that there are many modifications and changes.

Various aspects of the current embodiments may be embodied as a system, a method, or a computer program product. Therefore, various aspects of the present disclosure may take the following forms: a complete hardware embodiment, a complete software embodiment (including firmware, resident software, microcode, etc.), or a combination of software and hardware embodiments, which may be all regarded as "module" or "system" generally herein. In addition, any hardware and/or software technology, process, function, component, engine, module, or system described in the present disclosure may be implemented as a circuit or a group of circuits. In addition, various aspects of the present disclosure may take the form of a computer program product embodied in one or more computer-readable media on which computer-readable program code is embodied.

Any combination of one or more computer-readable media may be utilized. The computer-readable medium may be a computer-readable signal medium or a computer-readable storage medium. The computer-readable storage medium may be, for example, but not limited to, an electronic, magnetic, optical, electromagnetic, infrared, or semiconductor system, device or apparatus, or any suitable combination of the foregoing. More specific examples (non-exhaustive list) of computer-readable storage media may include each of the following: an electrical connection with one or more wires, a portable computer floppy disk, a hard disk, a random access memory (RAM), a read only memory (ROM), an erasable programmable read-only memory (EPROM or flash memory), an optical fiber, a portable CD-ROM, an optical storage apparatus, a magnetic storage apparatus, or any suitable combination of the foregoing. In the context of this document, a computer-readable storage medium may be any tangible medium that can contain or store a program for use by an instruction execution system, device, or apparatus or in combination with the instruction execution system, device, or apparatus.

The aspects of the present disclosure are described above with reference to flowchart illustrations and/or block diagrams of methods, devices (systems) and computer program products according, to the implementations of the present disclosure. It will be understood that each block of the flowchart illustrations and/or block diagrams and combinations of blocks in the flowchart illustrations and/or block diagrams may be implemented by computer program instructions. These computer program instructions may be provided to processors of general purpose computers, special purpose computers, or other programmable data processing devices to produce machines. When the instructions are executed via the processors of the computers or other programmable data processing devices, the functions/actions specified in the flowchart and/or block diagram block or multiple blocks can be realized. These processors m be, but are not limited to, general purpose processors, special purpose processors, special application processors, or field programmable gate arrays.

The flowcharts and block diagrams in the drawings illustrate the architecture, functionality, and operation of possible implementations of systems, methods, and computer program products according to various embodiments of the present disclosure. In this regard, each block in the flowchart or block diagram may represent a module, section, or part of code, and the code includes one or more executable instructions for implementing prescribed logical functions. It should also be noted that in some alternative implementations, the functionality described in the blocks may occur out of the order described in the drawings. For example, two blocks shown in succession may actually be executed substantially simultaneously, or the blocks may sometimes be executed in the reverse order depending on the functionality involved. It should also be noted that each block in the block diagram and/or flowchart illustration and the combination of the blocks in the block diagram and/or flowchart illustration can be implemented by a dedicated hardware-based system or dedicated hardware and computer instructions that perform the specified functions or actions.

Although the foregoing content is directed to the embodiments of the present disclosure, other and additional embodiments of the present disclosure may be conceived without departing from the basic scope of the present disclosure, and the scope of the present disclosure is determined by the appended claims.

While exemplary embodiments are described above, it is not intended that these embodiments describe all possible forms of the invention. Rather, the words used in the specification are words of description rather than limitation, and it is understood that various changes may be made without departing from the spirit and scope of the invention. Additionally, the features of various implementing embodiments may be combined to form further embodiments of the invention.

What is claimed is:

1. A limiter system for an active speaker, comprising:
    at least one lowpass filter configured to receive an input signal and output a signal lower than a crossover frequency;
    at least one highpass filter, configured to receive an input signal and output a signal higher than the crossover frequency;
    a first allpass filter configured to adjust the phase of the signal lower than the crossover frequency;
    a second allpass filter configured to adjust the phase of the signal higher than the crossover frequency;
    a first limiter, configured to receive and limit the signal from the first allpass filter;
    a second limiter, configured to receive and limit the signal from the second allpass filter; and
    a mixer, configured to mix the signal lower from the first limiter and the signal from the second limiter.

2. The limiter system of claim 1, wherein the phase of the signal lower than the crossover frequency is different from the phase of the signal higher than the crossover frequency.

3. The limiter system of claim 1, further comprising at least one other lowpass filter arranged after the first limiter and at least one other highpass filter arranged after the second limiter, each configured to limit signal amplitude above a predetermined threshold.

4. The limiter system of claim 3, wherein the at least one other lowpass filter includes two lowpass filters, and wherein the at least one other highpass filter, includes two highpass filters.

5. The limiter system of claim 3, wherein the at least one lowpass filter has a cutoff frequency that is about half of a cutoff frequency of the at least one other lowpass filter.

6. The limiter system of claim 3, wherein the at least one highpass filter has a cutoff frequency that is about half of a cutoff frequency of the at least one other highpass filter.

7. The limiter system of claim 1, wherein the first limiter is configured to cause the signal lower than the crossover frequency not to exceed a first limiting threshold, and the second limiter is configured to cause the signal higher than the crossover frequency not to exceed a second limiting threshold.

8. The limiter system of claim 7, wherein the first limiting threshold and the second limiting threshold are the same.

9. The limiter system of claim 7, wherein the first limiting threshold and the second limiting threshold are different.

10. The limiter system of claim 7, wherein the at least one lowpass filter includes two lowpass filters arranged upstream of the allpass filter to stabilize the input signal and wherein the at least one highpass filter includes two highpass filters arranged upstream of the second allpass filter to stabilize the input signal.

11. A limiting method for an active speaker comprising:
performing lowpass filtering by at least one lowpass filter to output a signal lower than a crossover frequency;
performing highpass filtering to output a signal higher than the crossover frequency;
manipulating a first phase of the signal lower than the crossover frequency;
manipulating a second phase of the signal higher than the crossover frequency;
limiting the signal at the first phase;
limiting the signal at the second phase; and
mixing the limited signals.

12. The limiting method of claim 11 wherein the first phase differs from the second phase.

13. The limiting method of claim 11, further comprising performing lowpass filtering on the limited signal at the first phase; and performing highpass filtering on the limited signal at the second phase to limit signal amplitudes above a predetermined threshold.

14. The limiting method of claim 13, wherein performing lowpass filtering to output a signal lower than a crossover frequency includes performing lowpass filtering by two lowpass filters, and wherein performing highpass filtering to output a signal higher than a crossover frequency includes performing highpass filtering by two highpass filters.

15. The limiting method of claim 14, wherein performing lowpass filtering on the limited signal at the first phase includes performing lowpass filtering by two other lowpass filters, and wherein performing highpass filtering on the limited signal at the second phase includes performing highpass filtering by two other highpass filters.

16. The limiting method of claim 15, wherein the two lowpass filters each have a crossover frequency that is about half of a crossover frequency of the other two lowpass filters.

17. The limiting method of claim 15, wherein the two highpass filters each have a crossover frequency that is about half of a crossover frequency of the other two highpass filters.

18. The limiting method of claim 11, wherein limiting the signal at the first phase includes setting a first limiting threshold, and wherein limiting the signal at the second phase includes setting a second limiting threshold.

19. The limiting method of claim 18 wherein the first limiting threshold and the second limiting threshold are the same.

20. The limiting method of claim 18, wherein the first limiting threshold and the second limiting threshold are different.

* * * * *